United States Patent [19]

Ishikawa et al.

[11] Patent Number: 4,612,464
[45] Date of Patent: Sep. 16, 1986

[54] HIGH SPEED BUFFER CIRCUIT PARTICULARLY SUITED FOR USE IN SAMPLE AND HOLD CIRCUITS

[75] Inventors: Fumio Ishikawa; Kuninobu Tanaka, both of Kanagawa, Japan

[73] Assignee: Sony Corporation, Tokyo, Japan

[21] Appl. No.: 573,636

[22] Filed: Jan. 25, 1984

[30] Foreign Application Priority Data

Jan. 28, 1983 [JP] Japan .............. 58-9989[U]

[51] Int. Cl.⁴ .............. H03K 17/06; H03K 17/04; H03K 17/60; H03K 3/26
[52] U.S. Cl. ................. 307/496; 307/500; 307/352; 307/270; 307/255; 307/246
[58] Field of Search .............. 307/352, 353, 570, 443, 307/491, 493, 494, 495, 496, 497, 500, 264, 270, 246, 552, 553, 558, 255; 328/115

[56] References Cited

U.S. PATENT DOCUMENTS

| | | | |
|---|---|---|---|
| 3,243,606 | 3/1966 | Green et al. | 307/270 |
| 3,329,836 | 7/1967 | Pearlman et al. | 307/491 |
| 3,432,688 | 3/1969 | Zola | 307/494 X |
| 3,437,836 | 4/1969 | Hull | 307/494 X |
| 3,480,800 | 11/1969 | Lynes et al. | 307/352 X |
| 3,539,835 | 11/1970 | Hinze | 307/264 X |
| 3,649,851 | 3/1972 | Cohen | 307/270 |
| 3,663,887 | 5/1972 | Dix | 307/530 |
| 3,854,057 | 12/1974 | Williams et al. | 307/270 X |
| 3,932,768 | 1/1976 | Takahashi et al. | 307/264 X |
| 4,149,098 | 4/1979 | Wright | 307/270 X |
| 4,419,593 | 12/1983 | Butler et al. | 307/255 X |

Primary Examiner—Stanley D. Miller
Assistant Examiner—David R. Bertelson
Attorney, Agent, or Firm—Lewis H. Eslinger; Alvin Sinderbrand

[57] ABSTRACT

A buffer circuit includes a main buffer circuit section formed of a pair of complementary input side transistors the bases of which are connected together to an input, a dummy circuit section having the same circuit construction as the main buffer circuit section, and a feedback signal section compares the output from the dummy circuit section with a predetermined value to provide a feedback signal which is supplied to the dummy circuit section and the main buffer circuit section so as to make the output of the dummy circuit section equal to that predetermined value.

3 Claims, 2 Drawing Figures

HIGH SPEED BUFFER CIRCUIT PARTICULARLY SUITED FOR USE IN SAMPLE AND HOLD CIRCUITS

BACKGROUND OF THE INVENTION

1. Field of the Invention

The present invention relates generally to buffer circuits and more particularly relates to a high speed buffer circuit having a high input impedance and being particularly suited for use in sample and hold circuits.

2. Description of the Prior Art

Generally, in a sample and hold circuit which intermittently samples a voltage signal to be processed and holds the sampled voltage in a capacitor, when the held voltagge which was sampled and held in the capacitor is delivered to a next stage circuit, it is desired that the input impedance of the next stage circuit be made as high as possible. If the input impedance of the next stage circuit is low, upon holding the voltage, the voltage is leaked from the capacitor to the next stage circuit. Thus, sampled and held voltage is lowered and the lowered voltage becomes an error.

To solve such problem, a circuit of current operation system which employs complementary bipolar transistors has been proposed as shown in FIG. 1. As seen in FIG. 1, this conventional circuit includes a main transistor T1 such as an NPN transistor which is connected as an emitter-follower type. The emitter of transistor T1 is connected to a constant current source 1 and the collector thereof is connected to a transistor T2 such as an NPN transistor which is included in a feedback circuit 2. To the base of the main transistor T1 is connected an input terminal 4 to which a sampled voltage from a sampling and holding capacitor 3 is supplied. Also, an output terminal 5 is connected to the emitter of the main transistor T1.

The feedback circuit 2 further includes transistors T3 and T4 connected in series between power source lines 6 and 7, with each of transistors T3 and T4 being a PNP transistor. The bases of transistors T2 and T3 are connected to each other, while the bases of transistor T4 and the main transistor T1 are connected to each other.

With the circuit constructed as shown in FIG. 1, it is assumed that the current amplification factors $h_{fe}$ of the PNP and NPN transistors are $\beta_P$ and $\beta_N$. In the feedback circuit 2, when a current I is derived from the emitter of transistor T2, its base current becomes $I/\beta_N$ which is derived from the base of transistor T3. Accordingly, the collector current of transistor T3 becomes $I \cdot \beta_P/\beta_N$ which then flows in the emitter of transistor T4. Therefore, the base current of transistor T4 becomes $I \cdot \beta_P/\beta_N \times 1/\beta_P = I/\beta_N$ which then flows in the base of the main transistor T1 as a feedback current.

When this feedback current flows in the base of the main transistor T1, the emitter current of the transistor T1 becomes $I/\beta_N \times \beta_N = I$. Thus, the current which flows from the emitter of transistor T2 to the collector of the main transistor T1 becomes equal to the emitter current of transistor T1 so that the circuit is placed in the stable state. This stable state is determined by the constants of the main transistor T1 and the transistors T2 to T4 in the feedback circuit 2 so that when the transistor T1 and the transistors T2 to T4 are formed on an integrated circuit (IC), the current I is determined.

In this stable state, when the sampled voltage $V_S$ of the capacitor 3 is supplied to the base of the main transistor T1, the emitter current I thereof changes in response thereto. This change is positively fed back through the loop of the feedback circuit 2 from the base current $I/\beta_N$ of transistor T2→the collector current of transistor T3→the base current of transistor T4→the emitter current of the main transistor T1 so that the circuit is placed in a new stable state. Thus, the voltage at the emitter of the transistor T1, and accordingly, the output voltage $V_0$ at terminal 5 is lower, by the base-emitter voltage $V_{BE}$ of the transistor T1, than the input voltage $V_S$. Therefore, the output voltage $V_0$ fluctuates in response to the input voltage $V_S$ and thus the circuitry constructed as shown in FIG. 1 is operated as a buffer circuit. In addition, when the above circuit is operated as a buffer circuit, it is not necessary to derive the base current from the input terminal 4 (namely, the sampling and holding capacitor 3 of the preceding stage) so as to operate the main transistor T1. The foregoing follows from the fact that the base current for operating main transistor T1 is equally supplied thereto from the feedback circuit 2.

Therefore, by the circuit construction shown in FIG. 1, without deriving the current from the input terminal 4, the output voltage $V_O$ which changes in accordance with the input voltage $V_S$ can be obtained. In other words, a buffer circuit having sufficiently high input impedance can be realized.

However, in the circuit constructed as shown in FIG. 1, since the correcting current which is supplied to the base of the main transistor T1 is positively fed back from the feedback circuit 2 on the basis of the collector current of the main transistor T1 (namely, the emitter current of transistor T2), when the level of the input voltage $V_S$ is changed at high speed, there is then a risk that an undesirable unstable operation such as a so-called ringing or the like may occur on the basis of the delay in the operation of the feedback circuit 2.

Moreover, when changes in the input voltage $V_S$ are of large amplitude and occur at high speed, the circuit of FIG. 1 has the disadvantage that the changed waveform of the ouput voltage $V_0$ becomes different between the leading edge and the trailing edge. In this connection, when the input voltage $V_S$ is raised at high speed by a large amount the emitter current of the main transistor T1 is made to flow greatly in a moment so that the output voltage $V_0$ rises up without delay. On the other hand, when the input voltage $V_S$ is lowered at high speed and by a large amount until the stray capacity at the emitter of the main transistor T1 is discharged by the current source 1, the main transistor T1 is turned off in an instant so that the output voltage $V_0$ falls down with significant delay.

If consideration is given to the use of an FET (field effect transistor) in the buffer circuit for the input voltage of large amplitude, a problem arises in manufacturing the FET together with the IC including bipolar transistors.

OBJECTS AND SUMMARY OF THE INVENTION

Accordingly, it is an object of the present invention to provide an improved buffer circuit.

It is another object of the present invention to provide a buffer circuit having a quite high input impedance.

It is a further object of the present invention to provide a buffer circuit including a bipolar transistor which can operate to practically cope with large amplitude changes occuring in an input voltage at high speed.

It is a still further object of the present invention to provide a buffer circuit which can surely prevent the flow of an input current even when there is a scattering in circuit elements.

According to one aspect of the present invention, there is provided a high input impedance circuit comprising:

first and second buffer circuits, each of said first and second buffer circuits including first and second pairs of NPN and PNP transistors, bases of said first pair of NPN and PNP transistors being connected to each other, emitters of said second pair of NPN and PNP transistors being connected to each other, emitters of said first pair of PNP and NPN transistors being connected respectively to the bases of said second NPN and PNP transistors, and first and second constant current circuits which are respectively connected to said emitters of said first pair of PNP and NPN transistors;

first and second constant current source circuits for driving said first and second constant current circuits of said first and second buffer circuits respectively; and a control circuit for controlling an amount of a current of at least one of said first and second constant current source circuits.

The above, and other objects, features and advantages of the present invention, will become apparent from the following description taken in conjunction with the accompanying drawings throughout which like references designate the same elements and parts.

DESCRIPTION OF THE PREFERRED EMBODIMENT

Figure 1:
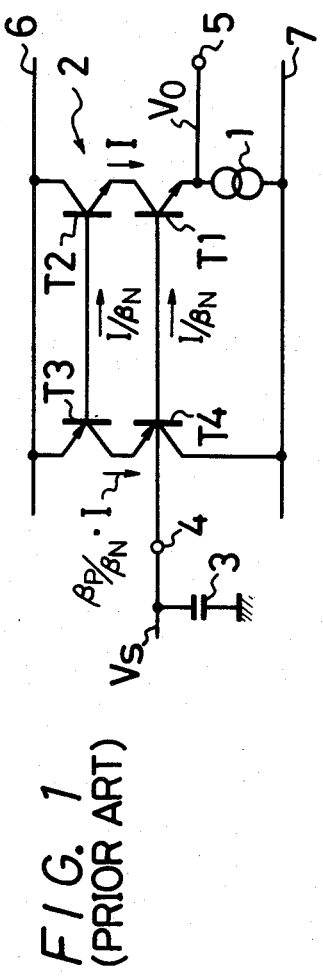
FIG. 1 is a connection diagram showing a conventional buffer circuit.

An embodiment of a buffer circuit according to the present invention will now be described in detail with reference to FIG. 2 in which the buffer circuit is shown generally a main buffer circuit section 8, a dummy circuit section 9 and a feedback circuit section, 10.

The main buffer circuit section 8 includes a pair of input side transistors T1A and T1B formed of PNP and NPN transistors which are connected complementary to each other. The bases thereof are connected directly to each other and then connected to an input terminal 11. The collectors thereof are respectively connected to negative and positive power source lines 12 and 13, while the emitters thereof are respectively connected through constant current source transistors T2A and T2B formed of PNP and NPN transistors to the positive and negative power source lines 13 and 12. And, the outputs are supplied to bases of output side transistors T3A and T3B from the emitters of the input side transistors T1A and T1B. Thus, the input side transistors T1A and T1B are connected in an emitter-follower circuit configuration.

The output side transistors T3A and T3B are formed of NPN and PNP transistors respectively, which are connected complementary to each other. The emitters thereof are connected commonly to an output terminal 14, while the collectors thereof are respectively connected to the positive and negative power source lines 13 and 12.

The dummy circuit section 9 is constructed the same as the main buffer circuit section 8 and includes input side transistors T4A and T4B, output side transistors T5A and T5B and constant current source transistors T6A and T6B.

The feedback circuit section 10 includes a pair of NPN transistors T7 and T8 which constitute a differential amplifying circuit 15. To the base of one transistor T7 is supplied the output which is derived from the emitters of the output side transistors T5A and T5B in the dummy circuit section 9. To the common connection point of the emitters of the transistors T7 and T8 is connected an NPN transistor T9 serving as a constant current source and the base of which is connected to the base of a constant current source driving transistor T10 and the emitter of a transistor T11.

To the base of the other transistor T8 of the differential amplifier is supplied a reference voltage $V_R$ which is obtained at the connection point of voltage-dividing resistors R1 and R2 connected in series between the positive and negative power source lines 13 and 12. Accordingly, the transistors T7 and T8 compare the output voltage $V_N$ from the dummy circuit section 9 with the reference voltage $V_R$ which is determined by the resistance values of the resistors R1 and R2 to thereby supply a current of a value corresponding to a difference between voltages $V_N$ and $V_R$ to other constant current source driving transistors T12 and T13 from the transistor T8.

Driving transistors T10 and T11 are connected through resistors R3 and R4 to the positive and negative power source lines 13 and 12, whereby a constant current which is determined by the resistance values of the resistors R3 and R4 is made to the transistors T7 and T8 from the transistor T9. The base of the driving transistor T10 is connected to the bases of the constant current source transistor T2B in the main buffer circuit section 8 and of the constant current source transistor T6B in the dummy circuit section 9 so that the value of a current supplied to input side transistors T1B and T4B is made coincident with a current value supplied to the constant current source transistor T9 in the feedback circuit section 10.

On the other hand, the emitter and base of the constant current source driving transistors T12 and T13, respectively, are connected to the bases of the constant current source transistor T2A in the main buffer circuit section 8 and of the constant current source transistor T6A in the dummy circuit section 9 so that the value of a current made to flow into the input side transistors T2A and T6A is controlled by a difference output derived from the differential amplifying circuit 15 in the feedback circuit section 10 so as to reduce this difference output to zero.

With the circuit construction as described above, the D. C. bias conditions of respective portions in the main buffer circuit section 8 are determined by the resistance values of the resistors R1, R2 and R3, R4 in the feedback circuit section 10. More specifically, since the dummy circuit section 9 is constructed the same as the main buffer circuit section 8, currents of the same values flow through the corresponding portions. The value of the current flowing through the constant current source transistor T6B in the dummy circuit section 9 (and hence through the constant current source transistor T2B in the main buffer circuit section 8) is determined by the resistance values of the resistors R3 and R4 connected to the driving transistors T10 and T11. Meanwhile, the value of the current flowing through the constant current source transistor T6A in the dummy circuit section 9 (and hence through the constant current source transistor T2A in the main buffer circuit section 8) is determined by the resistance values of the resistors R1 and R2 which are connected to the base of one transistor T8 in the differential amplifying circuit 15. The reason for the foregoing is that the constant current source transistor T6A in the dummy circuit section 9 is controlled by the output from the driving transistors T12 and T13 so as to make the output voltage $V_N$ from the emitters of the output side transistors T5A and T5B in the dummy circuit section 9 equal to the reference voltage $V_R$.

When the feedback system which is established by feeding the output voltage $V_N$ of the dummy circuit section 9 back to the constant current source transistor T6A through the differential amplifying circuit 15 is made to be in the stable state as described above, a current Ia derived from the emitter of the input side transistor T4A to the base thereof is all supplied through the base of the input side transistor T4B to the emitter of the latter. This operation condition can also be established for the main buffer circuit section 8 of the same construction as the dummy circuit section 9. In other words a stable state in which the output of the emitters of the output side transistors T3A and T3B is fed back to the constant current source transistor T2A through the differential amplifying circuit 15 is equivalently established in the main buffer circuit section 8.

Consequently, also in the main buffer circuit section 8, the current delivered from the emitter of the transistor T1A to the base thereof becomes Ia and the current delivered from the base of the transistor T1B to the emitter thereof also becomes Ia. Therefore, it is not necessary to take in any current from an external circuit connected to the input terminal 11 (for example, a capacitor 17 for sampling and holding) so as to drive the main buffer circuit section 8.

Under the above biasing condition, the input voltage $V_S$ applied to the input terminal 11 is transmitted through the base-emitter path of the input side PNP transistor T1A and the base-emitter path of the output side NPN transistor T3A to the output terminal 14. The input voltage $V_S$ is also transmitted through the base-emitter path of the input side NPN transistor T1B and the base-emitter path of the output side PNP transistor T3B to the output terminal 14. Accordingly, in one transmission path, the potential is raised temporarily high by the base-emitter voltage of the input side PNP transistor T1A and this potential is lowered by the base-emitter voltage of the output side NPN transistor T3A, while in the other transmission path, the potential is lowered temporarily by the base-emitter voltage of the input side NPN transistor T1B and this potential is raised high by the base-emitter voltage of the output side PNP transistor T3B.

If the above circuit is formed on a single IC chip, the base-emitter voltages of the transistors T1A and T3B, each transistor being a PNP transistor, become substantially equal to each other and the base-emitter voltages of the transistors T1B and T3A, each transistor being an NPN transistor, become substantially equal to each other. Therefore, in both of the transmission paths, the relation of the potential at the output terminal 14 relative to the potential at the input terminal 11 becomes equal to each other with the result that, as the input voltage $V_S$ is changed, the output voltage $V_0$ is changed in correspondence thereto. Moreover, even when the voltage in the transmission path for the output signal is changed, the D. C. bias condition in the dummy circuit section 9 is never changed so that the current value which is fed back to the constant current source transistor T2A in the main buffer circuit section 8 is never changed. As a result, the input side transistors T1A and T1B in the main buffer circuit section 8 maintain the above described state in which the transistors T1A and T1B do not take in the current from the external circuit by way of the input terminal 11.

Figure 2:
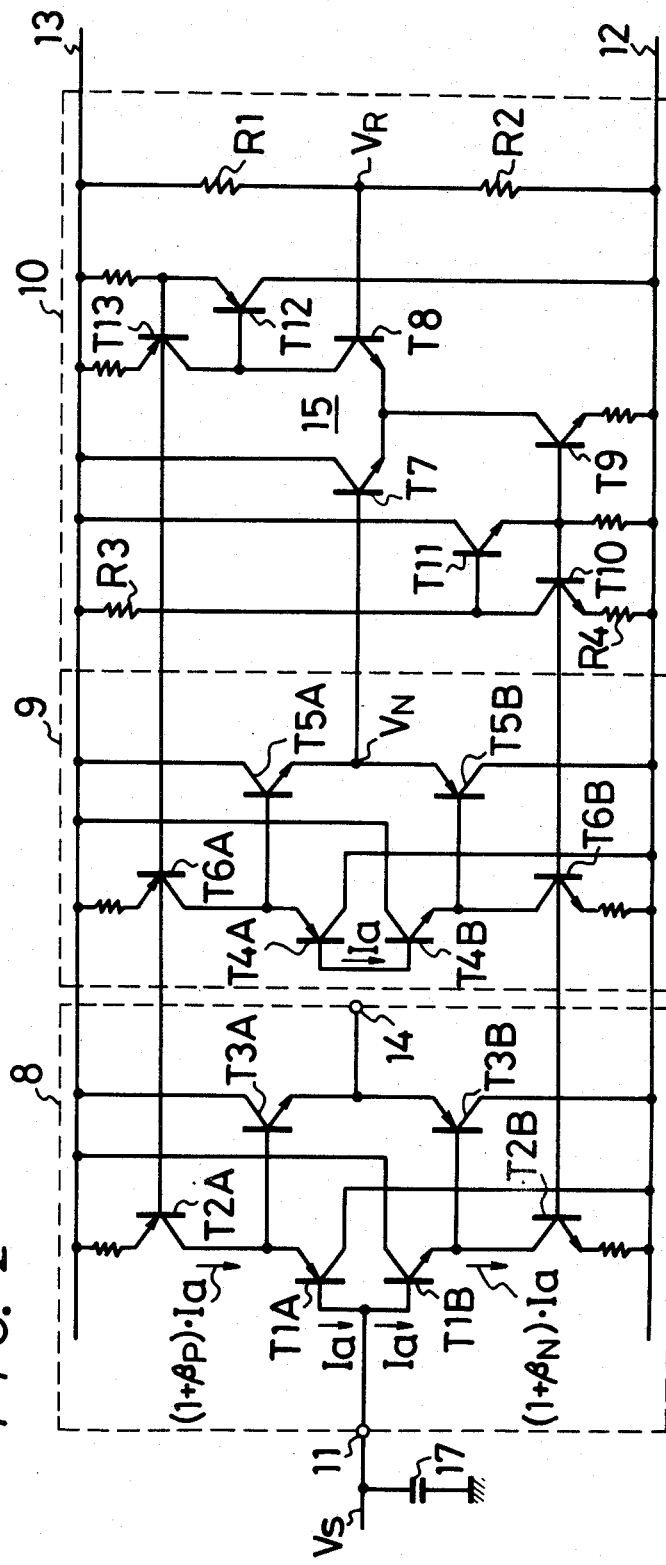
FIG. 2 is a connection diagram showing an embodiment of a buffer circuit according to the present invention.

Furthermore, even if the current amplification factor $h_{fe}$ of the transistors are scattered or slightly different at each substrate when the circuit construction shown in FIG. 2 is formed on a number of the IC substrates, the current which is fed back to the constant current source transistor T6A (and hence to the constant current source transistor T2A in the main buffer circuit section 8) through the differential amplifying circuit 15 by the output from the dummy circuit section 9 is changed in correspondence with such scattering to thereby establish the stable state in which the output voltage $V_N$ from the dummy circuit section 9 is coincident with the reference voltage $V_R$. Thus the scattering of the current amplification factors $h_{fe}$ is corrected or compensated.

As described above, in the circuit according to the present invention constructed as shown in FIG. 2, without taking in current to the input terminal 11 from the external circuit, the input voltage $V_S$ can be transmitted to the output terminal 14, thus providing a buffer circuit having a substantially large input impedance. Further, in accordance with the present invention, essentially complementary circuits are provided so that even when the input voltage $V_S$ is changed over the range from the positive to the negative, the above described circuits can be operated in the same manner. Therefore, it is possible to transmit a signal changing at high speed and with large amplitude.

By way of summary, according to the present invention, the dummy circuit 9 is provided with the same circuit construction as the main buffer circuit 8 including the complementary input side transistors, and the output from the dummy circuit is compared with the reference voltage by the differential amplifying circuit 15 to provide the correcting feedback signal for the constant current sources of the dummy circuit and the main buffer circuit. Therefore, even if the current amplification factors of the transistors are scattered, such scattered current amplification factors can be corrected so that the buffer circuit, which always has a high input impedance and which can transmit a input signal changing at high speed and with large amplitude, can be realized by using bipolar transistors.

Although a single preferred embodiment of the invention is described above with reference to the drawing, it will be apparent that the invention is not limited to that precise embodiment, and that many modifications and variations could be effected therein by one skilled in the art without departing from the spirit or scope of the invention as defined by the appended claims.

We claim as our invention:
1. A high input impedance circuit comprising:
   main buffer circuit means, dummy circuit means and feedback circuit means;

each of said main buffer circuit means and said dummy circuit means including a first pair of NPN and PNP transistors and a second pair of NPN and PNP transistors, each of said transistors having a base, emitter and collector, said bases of said first pair of transistors being connected to each other, said emitters of said second pair of transistors being connected to each other, said emitters of said PNP and NPN transistors of said first pair being connected to said bases of said NPN and PNP transistors, respectively, of said second pair, and first and second constant current circuits connected to said emitters of said PNP and NPN transistors, respectively, of said first pair;

power source means of first and second opposed polarities connected to said collectors of said NPN and PNP transistors, respectively, of each of said first and second pairs of transistors;

input means connected to the connected together bases of said first pair of transistors of said main buffer circuit means;

output means connected to the connected together emitters of said second pair of transistors of said main buffer circuit means; and said feedback circuit means includes first and second constant current source circuits for driving said first and second constant current circuits, respectively, of said main buffer circuit means and of said dummy circuit means, and control circuit means for controlling an amount of a current of at least one of said first and second constant current source circuits so as to achieve substantial equality of a voltage at the connected together emitters of said second pair of transistors in said dummy circuit means with a reference voltage and thereby causing the voltage at said output means to vary with any voltage changes at said input means without requiring any current flow from said input means.

2. A high input impedance circuit comprising:
first and second buffer circuits;
each of said buffer circuits including a first pair of NPN and PNP transistors each having a base, emitter and collector and a second pair of NPN and PNP transistors each having a base, emitter and collector, said bases of the first pair of transistors being connected to each other, said emitters of the second pair of transistors being connected to each other, said emitters of said PNP and NPN transistors of said first pair being connected to said bases of said NPN and PNP transistors, respectively, of said second pair, and first and second constant current circuits which are respectively connected to said emitters of said first pair of PNP and NPN transistors;

power source means to which said collectors of said NPN and PNP transistors of the first and second buffer circuits are connected;

input means connected to the connected together bases of said first pair of transistors of said first buffer circuit;

output means connected to said connected together emitters of said second pair of transistors of said first buffer circuit;

first and second constant current source circuits for driving said first and second constant current circuits of said first and second buffer circuits respectively; and a control circuit for controlling an amount of a current of at least one of said first and second constant current source circuits including a differential amplifier having first and second input terminals connected to the emitters of said second pair of NPN and PNP transistors of said second buffer circuit and to a source of a predetermined voltage potential, respectively, and an output terminal of said differential amplifier being connected to at least one of said first and second constant current source circuits.

3. A high input impedance circuit according to claim 2, further comprising a capacitor which is connected between said input means and a common terminal.

* * * * *